United States Patent
Clube et al.

(10) Patent No.: US 9,658,535 B2
(45) Date of Patent: May 23, 2017

(54) METHODS AND SYSTEMS FOR PRINTING PERIODIC PATTERNS

(71) Applicant: EULITHA A.G., Wurenlingen (CH)

(72) Inventors: Francis Clube, Windisch (CH); Harun Solak, Brugg (CH); Christian Dais, Brugg (CH)

(73) Assignee: Eulitha A.G., Wurenlingen (CH)

( * ) Notice: Subject to any disclaimer, the term of this patent is extended or adjusted under 35 U.S.C. 154(b) by 54 days.

(21) Appl. No.: 14/778,324

(22) PCT Filed: Mar. 18, 2014

(86) PCT No.: PCT/IB2014/059949
§ 371 (c)(1),
(2) Date: Sep. 18, 2015

(87) PCT Pub. No.: WO2014/147562
PCT Pub. Date: Sep. 25, 2014

(65) Prior Publication Data
US 2016/0062246 A1    Mar. 3, 2016

Related U.S. Application Data

(60) Provisional application No. 61/802,882, filed on Mar. 18, 2013.

(51) Int. Cl.
*G03B 27/54* (2006.01)
*G03F 7/20* (2006.01)

(52) U.S. Cl.
CPC ........ *G03F 7/70191* (2013.01); *G03F 7/7035* (2013.01); *G03F 7/70408* (2013.01)

(58) Field of Classification Search
CPC . G03F 7/70191; G03F 7/7035; G03F 7/70408
(Continued)

(56) References Cited

U.S. PATENT DOCUMENTS

| 8,368,871 B2 | 2/2013 | Solak et al. |
| 8,525,973 B2 | 9/2013 | Solak et al. |

(Continued)

FOREIGN PATENT DOCUMENTS

| WO | 2012066489 A2 | 5/2012 |
| WO | 2012085845 A1 | 6/2012 |

(Continued)

OTHER PUBLICATIONS

C. Zanke et al., "Large area patterning for photonic crystals via coherent diffraction lithography", J. Vac. Sci. Technol., B22, 3352, (2004).

(Continued)

*Primary Examiner* — Peter B Kim
(74) *Attorney, Agent, or Firm* — Laurence A. Greenberg; Werner H. Stemer; Ralph E. Locher

(57) ABSTRACT

A method for printing a periodic pattern of features into a photosensitive layer includes providing a mask bearing a periodic pattern, providing a substrate bearing the photosensitive layer, and arranging the substrate substantially parallel to the mask. A beam of collimated monochromatic light is formed for illuminating the mask pattern so that the light-field transmitted by the mask forms Talbot image planes separated by a Talbot distance. N sub-exposures of the mask with the beam are performed and the separation between sub-exposures are changed so that the relative separation during the ith sub-exposure with respect to that during the first sub-exposure is given by $(m_i + n_i/N)$ times the Talbot distance. The mask pattern is exposed to the same energy density of illumination for each sub-exposure, wherein the period is selected in relation to the wavelength so that only the zeroth and first diffraction orders are transmitted by the mask.

20 Claims, 12 Drawing Sheets

(58) Field of Classification Search
USPC .......................................................... 355/67
See application file for complete search history.

(56) References Cited

U.S. PATENT DOCUMENTS

| | | |
|---|---|---|
| 8,904,316 B2 | 12/2014 | Solak et al. |
| 2008/0186579 A1 | 8/2008 | Solak |
| 2012/0009525 A1 | 1/2012 | Clube et al. |
| 2012/0092634 A1 | 4/2012 | Solak et al. |
| 2012/0092635 A1 | 4/2012 | Solak et al. |
| 2012/0221700 A1 | 8/2012 | Dutta et al. |
| 2013/0308112 A1 | 11/2013 | Clube et al. |
| 2013/0323651 A1 | 12/2013 | Solak et al. |
| 2014/0307242 A1 | 10/2014 | Solak et al. |

FOREIGN PATENT DOCUMENTS

| | | |
|---|---|---|
| WO | 2012095795 A2 | 7/2012 |
| WO | 2012164539 A1 | 12/2012 |

OTHER PUBLICATIONS

H. H. Solak et al., "Achromatic Spatial Frequency Multiplication: A Method for Production of Nanometer-Scale Periodic Structures", J. Vac. Sci. Technol., 23, pp. 2705-2710, (2005).

Top view

Side view

TOP DOWN VIEW

SIDE VIEW

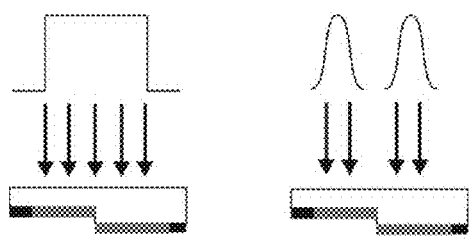
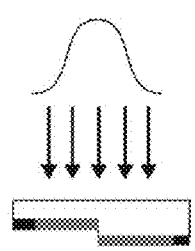
FIG. 14
FIG. 15A
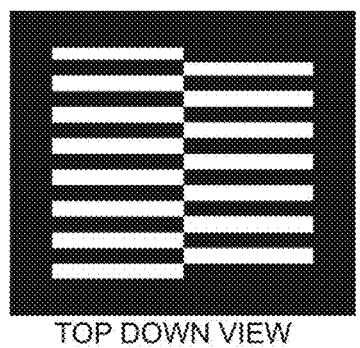
TOP DOWN VIEW
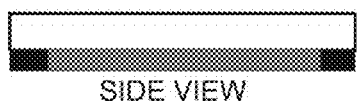
SIDE VIEW

TOP DOWN VIEW

SIDE VIEW

TOP DOWN VIEW

SIDE VIEW

METHODS AND SYSTEMS FOR PRINTING PERIODIC PATTERNS

BACKGROUND OF THE INVENTION

Field of the Invention

Lithographic fabrication enables the formation of micro- and nano-patterns on surfaces. Photolithographic techniques achieve this by exposing a photosensitive surface to a light-field with an intensity distribution corresponding to the desired pattern. The photosensitive surface is usually a thin layer of a sensitive material, such as photoresist, which is coated either directly on a substrate surface or indirectly over intermediate layers of other materials. Chemical or physical changes that occur in the photosensitive layer as a result of the exposure are used in subsequent processes to obtain a desired pattern in the material of the substrate or in an intermediate layer of another material. In the most commonly used photolithographic technique an image of a pattern defined in a mask is projected onto the substrate surface using an optical system. The masks generally employed in such conventional systems are amplitude masks in which the pattern features are defined as open areas in a layer of an opaque material, usually chrome, on a transparent substrate. Phase-shift masks (PSMs) are alternatively used in which the pattern features are defined using a certain thickness of a material or a depth of recess into a material, so that the light propagating through those features is shifted in phase with respect to other propagating light, which then mutually interfere in the image plane to form the desired pattern. In the case of PSMs employed in projection, contact, proximity or conventional Talbot lithography, the mask is designed by considering the interference between all the diffraction orders transmitted by the mask and any optics. In the case of a one-dimensional pattern, a PSM can reduce the minimum printable period by a factor of two with respect to an amplitude mask. This is mainly achieved by suppressing the 0th-order diffracted beam, thereby eliminating the intensity modulation produced by its interference with the 1st-order diffracted beams.

For many applications patterns are required that comprise a unit cell of pattern features that repeat in one or two dimensions, that is, periodic patterns. A specialized photolithographic technique for transferring such patterns from masks onto substrates is based on the Talbot effect. When a periodic pattern defined in a mask is illuminated with a collimated beam of monochromatic light, diffraction orders in the transmitted light-field reconstruct "self-images" of the pattern at regular distances from the mask in so-called Talbot planes. The separation of these self-images, $L_T$, which is known as the Talbot distance, depends on the illumination wavelength, $\lambda$, and period of the pattern, p, according to:

$$L_T \approx \frac{kp^2}{\lambda} \qquad \text{equ. (1)}$$

where k is a constant.

For a one-dimensional periodic pattern of lines and spaces, k=2, whereas for two-dimensional periodic patterns, the value of k depends on the array symmetry of the pattern. Although this formula has good accuracy when $p \gg \lambda$ (i.e. when the angle of the first diffracted order is small), it approximates less well as the magnitude of p approaches $\lambda$. Locating a photoresist-coated substrate at one of the self-image planes results in the mask pattern being printed into the photoresist (see, for example, C. Zanke, et al., "Large area patterning for photonic crystals via coherent diffraction lithography", J. Vac. Sci. Technol. B 22, 3352 (2004)). Furthermore, at intermediate distances between the self-image planes, Talbot sub-images are formed that have higher spatial frequencies than the pattern in the mask, which may be printed by placing a photoresist-coated substrate at one of these sub-image planes. The printed results achieved using these techniques are improved when the duty cycle of the mask pattern (i.e. the dimension of the features as a fraction of the feature period) is selected to produce a high contrast of intensity variation in the Talbot or sub-image plane (see U.S. Pat. No. 4,360,586). It is also known in the prior art that the contrast of the Talbot images can be further enhanced by fabricating the periodic patterns in the mask using phase shifting materials. Photolithography using Talbot imaging is especially advantageous for printing high-resolution periodic patterns in view of the cost of conventional, projection-type photolithographic systems for printing high-resolution patterns.

A major shortcoming of the Talbot technique, however, is the sensitivity of the intensity distributions of the self-images and sub-images to the distance from the mask, that is, they have a limited depth of field. This means that the substrate needs to be positioned accurately with respect to the mask in order to correctly print the pattern. This becomes increasingly more difficult as the grating period is reduced because the depths of field of the self-images and sub-images are proportional to the square of the pattern period. Furthermore, if the pattern needs to be printed onto a substrate surface that is not very flat, onto a surface that already has a high-relief micro-pattern on its surface, or into a thick layer of photoresist, then it may be impossible to achieve the desired result.

Achromatic Talbot lithography (ATL) has recently been introduced as a new method for printing high-resolution periodic patterns in a cost effective way (see H. H. Solak, et al., "Achromatic Spatial Frequency Multiplication: A Method for Production of Nanometer-Scale Periodic Structures", J. Vac. Sci. Technol., 23, pp. 2705-2710 (2005), and U.S. Pat. Appl. no. 2008/0186579). It offers two significant advantages for lithographic applications: firstly, it overcomes the depth-of-field problem encountered using the classical Talbot method; and, secondly, for many pattern types it performs a spatial-frequency multiplication, that is, it increases the resolution of the printed features with respect to that of the pattern in the mask. In ATL the mask is illuminated with a collimated beam from a light source with a broad spectral bandwidth, and beyond a certain distance from the mask the transmitted light-field forms a so-called stationary image whose intensity distribution is substantially invariant to further increase in distance. In the case of a one-dimensional pattern of lines and spaces (i.e. a linear grating), the minimum distance, $d_{min}$, from the mask at which this occurs is related to the period, p, of the pattern in the mask and to the full width at half maximum, $\Delta\lambda$, of the beam's spectral profile by:

$$d_{min} \approx \frac{2p^2}{\Delta\lambda} \qquad \text{equ. (2)}$$

Beyond this distance, the Talbot image planes for the different wavelengths are distributed in a continuous manner with increasing distance from the mask, which gives rise to the stationary image. Thus, by placing a photoresist-coated substrate in this region exposes the substrate to the entire range of transverse intensity distributions formed between successive Talbot planes for a particular wavelength. The pattern printed onto the substrate is therefore an average, or integration, of this range of transversal intensity distributions, which is substantially insensitive to longitudinal displacement of the substrate with respect to the mask. The technique therefore enables a much larger depth of field than with standard Talbot imaging, and a much larger depth of field than with conventional projection, proximity or contact printing.

The intensity distribution in an ATL image from a particular mask pattern may be determined using modeling software that simulates the propagation of electromagnetic waves through and after the mask. Such simulation tools may be used to optimize the design of the pattern in the mask for obtaining a particular printed pattern at the substrate surface.

The ATL method has been developed primarily to print periodic patterns that comprise a unit cell that repeats with a constant period in at least one direction. The technique may, however, also be successfully applied to patterns whose period spatially varies in a sufficiently "slow", gradual way across the mask such that the diffraction orders that form a particular part of the stationary image are generated by a part of the mask in which the period is substantially constant. Such patterns may be described as being quasi-periodic.

A drawback of ATL is that it requires a light source with a significant spectral bandwidth in order that the separation required between the mask and substrate is not disadvantageously large. The angular divergence of the different diffracted orders propagating from the mask produces spatial offsets between the different orders at the substrate surface resulting in imperfect image reconstruction at the pattern edges, which becomes worse with increasing separation. Fresnel diffraction at the edges of the diffracted orders also degrades the edges of the printed pattern, and this likewise gets worse with increasing separation. For these reasons laser sources, which have relatively small spectral bandwidth, are in most cases unsuitable for ATL.

A difficulty with applying non-laser sources, such as arc lamps or light emitting diodes, to ATL is producing an exposure beam of the required dimensions that has the combination of high power for ensuring high throughput in a production process and good collimation for imaging high-resolution features. The collimation of beams from such sources may be improved to the required level by spatial filtering but this generally results in an unacceptable loss of the beam power.

The advantages of the ATL technique may be obtained using a different but related technique that is disclosed in U.S. Pat. Appl. no. 2008/0186579. In this scheme, the periodic pattern in the mask is illuminated by a collimated beam of monochromatic light and during exposure the distance of the substrate from the mask is varied over a range corresponding to an integer multiple of the separation between successive Talbot image planes in order that an average of the intensity distributions between Talbot planes is printed on the substrate. The smallest displacement that may be employed is therefore equal to the separation of successive Talbot planes (when integer=1). With this displacement during exposure, the pattern printed on the substrate is substantially the same as that printed using the ATL technique. It is disclosed that the displacement may be performed either continuously or in a discrete way by exposing the substrate at multiple discrete positions over the range. The general technique may be referred to as displacement Talbot lithography (DTL).

The average intensity distributions generated at the substrate using the ATL and DTL techniques are essentially equivalent and both enable a large depth of field and spatial-frequency multiplication for the printed pattern. The DTL scheme can be used with much smaller separations of the substrate and mask than the ATL scheme. This reduces the degradation of the pattern edges and allows more efficient utilization of the output from the light source because of the less demanding requirement on collimation. Further, the DTL technique enables the use of laser sources, which may be preferred for production processes. The light from such sources can be formed into well-collimated beams with negligible loss of power, so minimize loss of feature resolution and maximize image contrast.

The structure of the patterns printed using DTL from a particular mask pattern may also be theoretically determined using simulation software.

A limitation of the DTL technique described in U.S. Pat. Appl. no. 2008/0186579 is that the longitudinal displacement of the substrate relative to the mask during exposure should correspond accurately to an integer multiple of the Talbot distance. When the displacement is exactly an integer multiple, the average intensity distribution exposing the substrate is independent of the initial separation of the substrate and mask, and so produces a uniform exposure of the pattern features on the substrate even if the mask and substrate are not accurately flat and parallel. If, on the other hand, the displacement is not an exact integer multiple of the Talbot distance because of, for example, mechanical hysteresis or limited stepping resolution of a displacement actuator, or because of inexact synchronization between the duration of the exposure by the illumination system and the displacement of the substrate, then the average intensity distribution depends on the initial separation. In this case, if the mask and substrate are not accurately flat and parallel, then a spatial variation of feature size is introduced into the printed pattern; or if the mask and substrate are accurately flat and parallel but their separation is different for different substrates, then the size of the printed features varies from substrate to substrate; both of which may be problems for certain applications. These variations of feature size may be reduced by longitudinally displacing the substrate by a large number of Talbot distances relative to the mask, but this can introduce other problems such as degradation of the feature resolution (if the illumination beam is not well collimated), distortion of the feature shape (if the direction of displacement is not accurately longitudinal), degradation of the pattern edges (if the gap becomes too large), and disadvantageously requires larger travel range in the mechanical system.

U.S. application Ser. No. 13/035,012, which is incorporated herein by reference, teaches a modification of the DTL technique for overcoming this limitation so as to enable periodic or quasi-periodic patterns to be printed uniformly and reproducibly without requiring that the longitudinal displacement of the substrate during exposure correspond accurately to an integer multiple of the Talbot distance. It further enables periodic patterns to be printed uniformly and reproducibly when the presence of 2nd or higher diffraction orders in the transmitted light-field from the mask prevents exact Talbot imaging and an exact Talbot distance. It additionally enables two-dimensional periodic patterns of features to be printed uniformly and reproducibly onto substrates when the periods of the pattern are different along different axes. It, moreover, enables a pattern of features to be printed uniformly and reproducibly onto a substrate when the period of the pattern in the mask is not constant but varies across the mask either continuously, as in a chirped grating, or step-wise. The application teaches that the exposure dose per incremental displacement of the substrate relative to the mask is varied during the displacement by either changing the speed of displacement or by varying the intensity of the exposure beam. In particular it advocates that the exposure dose per incremental displacement of the substrate should varied according to a Gaussian or similar profile, either by varying the illumination intensity according to the required or by varying the speed of displacement according to the inverse of the profile.

This modified DTL technique though also has certain disadvantages. Varying the intensity of the illumination beam during the displacement of the substrate relative to the mask necessarily means that the output of the illumination source is not being optimally used which results in a longer exposure, which is undesirable for a production process; whereas varying the speed of displacement of the substrate relative to the mask so that it corresponds to the inverse of a Gaussian or similar profile imposes additional mechanical requirements on the exposure system which may be difficult and costly to provide, especially if the exposure time required is short and/or the substrate is large.

U.S. patent application Ser. Nos. 12/706,081 and 13/218,567 describe related techniques in which ATL or DTL exposures are performed using an illumination beam that does not illuminate the periodic mask pattern at a single angle of incidence but with a range of angles. They describe that the light at the different angles in the range may illuminate the mask either sequentially or simultaneously, using appropriate embodiments. This illumination method enables a greater range of shapes and resolutions of the printed features than the pure ATL or DTL techniques.

International patent application PCT/IB2011/055133 describes a variety of designs of phase-shift mask having periodic structures which are employed with ATL- or DTL-type exposures in order to print patterns with a number of advantageous properties.

International patent application PCT/IB2011/055827 describes a related technique in which a periodic pattern in a mask is tilted at a predetermined angle respect to a substrate to be printed, and then displaced with respect to the substrate during the exposure in order to expose the substrate to the range of transversal intensity distributions between successive Talbot planes. The resulting exposure is equivalent to that produced by the ATL and DTL techniques.

International patent application PCT/IB2012/050128 describes a related technique in which a periodic pattern in a mask is illuminated by an instantaneously monochromatic beam whose wavelength is scanned across a spectral bandwidth during the exposure of a substrate arranged in proximity. The bandwidth is arranged in relation to the separation of the substrate and mask so that the resulting exposure is equivalent to that produced by ATL.

International patent application PCT/IB2012/052778 describes a further related technique in which an array of lasers, which emit light at a plurality of wavelengths over a spectral bandwidth, is employed to illuminate a periodic pattern in a mask that is arranged in proximity to a substrate. The bandwidth of wavelengths and the separation of the substrate and the mask are arranged in order that the resulting exposure of the substrate is equivalent to that produced by ATL.

Whereas each of the latter two techniques provides an alternative means to obtain an ATL-type exposure, they both add a complexity and associated cost to the illumination system that may be undesirable.

BRIEF SUMMARY OF THE INVENTION

It is therefore an object of the present invention to provide a method and apparatus with the same advantages as ATL and related techniques for printing a periodic or quasi-periodic pattern of features onto a photoresist-coated substrate, that is with a large depth of focus and with the possibility of spatially-frequency-multiplication between the mask and printed patterns, but without the disadvantages of those techniques. In particular, it is an object of the present invention to provide an ATL-equivalent technique that enables the illumination source to be a laser, that does not require the substrate to be displaced with a varying speed during the exposure, does not require a complex and/or costly illumination system having a plurality of laser sources or a laser whose wavelength is variable during the exposure, and does not require the substrate to be tilted with respect to the mask during the exposure.

According to a first aspect of the present invention, a method is provided for printing a desired one-dimensional or two-dimensional periodic pattern of features into a photosensitive layer, which method includes:

a) providing a mask bearing a periodic mask pattern of features;

b) providing a substrate bearing the photosensitive layer;

c) arranging the substrate substantially parallel to and with a separation from the mask;

d) forming a beam of collimated monochromatic light for illuminating said mask pattern so that the Light-field transmitted by the mask forms Talbot image planes separated by a Talbot distance; and f) performing N sub-exposures of the mask with said beam and changing the separation between sub-exposures such that the relative separation during the ith sub-exposure with respect to that during the first sub-exposure is given by $(m_i+n_i/N)$ times the Talbot distance, where values $m_i$ is an integer and $n_i$ takes each of the integer values from 0 to N−1 for the different sub-exposures;

wherein the period is selected in relation to the wavelength of illumination so that substantially only the zeroth and first diffraction orders are transmitted by the mask.

According to a second aspect of the present invention, an apparatus is provided for printing a desired one-dimensional or two-dimensional periodic pattern of features into a photosensitive layer, which apparatus includes:

a) a mask bearing a periodic mask pattern of features;

b) a substrate bearing the photosensitive layer;

c) a means for arranging the substrate substantially parallel to and with a separation from the mask;

d) a means for forming a beam of collimated monochromatic light for illuminating said mask pattern so that the Light-field transmitted by the mask forms Talbot image planes separated by a Talbot distance; and f) a means for performing N sub-exposures of the mask with said beam and changing the separation between sub-exposures such that the relative separation during the ith sub-exposure with respect to that during the first sub-exposure is given by $(m_i+n_i/N)$ times the Talbot distance, where values $m_i$ is an integer and $n_i$ takes each of the integer values from 0 to N−1 for the different sub-exposures;

wherein the period is selected in relation to the wavelength of illumination so that substantially only the zeroth and first diffraction orders are transmitted by the mask.

According to a third aspect of the present invention, a method is provided for printing a desired one-dimensional or two-dimensional periodic pattern of features into a photosensitive layer, which method includes:

a) providing a mask bearing a one-dimensional or two-dimensional periodic mask pattern of features;

b) providing a substrate bearing the photosensitive layer;

c) arranging the substrate substantially parallel to and with a separation from the mask;

d) forming a beam of collimated monochromatic light for illuminating said mask pattern; and e) illuminating the mask pattern with said beam in a first sub-exposure so as to expose the layer to an intensity distribution; and f) arranging that the intensity distribution to expose the layer in a second sub-exposure is laterally displaced relative to the first sub-exposure by a distance and in a direction that correspond to those between a feature in the mask pattern and a point in the mask pattern that is equidistant, in the case of a one-dimensional pattern, between two neighboring mask features or, in the case of a two-dimensional pattern, between at least three neighboring mask features;

e) illuminating the mask pattern with said beam so that the layer is exposed to said intensity distribution in the second sub-exposure; and wherein the period is selected in relation to the wavelength of illumination so that substantially only the zeroth and first diffraction orders are generated by the mask.

According to a fourth aspect of the present invention, an apparatus is provided for printing a desired one-dimensional or two-dimensional periodic pattern of features into a photosensitive layer, which method includes:

a) a mask bearing a one-dimensional or two-dimensional periodic mask pattern of features;

b) a substrate bearing the photosensitive layer;

c) a means for arranging the substrate substantially parallel to and with a separation from the mask;

d) a means for forming a beam of collimated monochromatic light for illuminating said mask pattern;

e) a means for performing sub-exposures of the mask using said beam and controlling the energy density delivered in each sub-exposure; and f) a means for arranging that the intensity distribution exposing the layer is laterally displaced between sub-exposures by a distance and in a direction that correspond those between a feature in the mask pattern and a point in the mask pattern that is equidistant, in the case of a one-dimensional pattern, between two neighboring mask features or, in the case of a two-dimensional pattern, between at least three neighboring mask features;

wherein the period is selected in relation to the wavelength of illumination so that substantially only the zeroth and first diffraction orders are generated by the mask.

Preferably, the displacement of the intensity distribution at the photosensitive layer relative to the first exposure is produced by displacing one of the substrate and mask between sub-exposures, or it may be equivalently obtained by changing the angle of the illumination beam between sub-exposures such that the product of the change of angle and the separation between the mask and substrate corresponds to the displacement required.

For all aspects of the invention the pattern of features in the mask may be formed as transparent features in an otherwise opaque layer, or may be light-blocking features in an otherwise transparent mask. Alternatively, both the features and the surrounding area may be transparent or semi-transparent, and formed in a material or materials whose relative thicknesses and/or depths at the features introduce a difference in phase between the light transmitted by the features with respect to that transmitted by the surrounding area, i.e. the mask is a phase-shift mask.

In all aspects of the invention, the intensity of the illumination beam is preferably the same for each sub-exposure. It is further preferable that the illumination be discontinued (e.g. using a shutter) when the separation is being changed between sub-exposures or when arranging the displacement of the intensity distribution at the layer prior to the second sub-exposure. The illumination may alternatively be continuous during the sub-exposures and the change of separation or displacement of the intensity distribution. In this case the separation should be changed or the intensity distribution should be displaced in a time that is negligible (preferably <1/50) in comparison with the time for the sub-exposures, so that the energy density of exposure during the change of separation or displacement of the intensity distribution has negligible effect on the printed result.

In all aspects of the invention, preferably only zeroth and first diffraction orders propagate from the mask but second or higher orders can be tolerated if they do not contribute significantly to the printed intensity distribution. For example, printed feature size variations caused by the presence of such orders should preferably be less than one-tenth or one-twentieth of the feature size.

In all aspects of the invention, the accuracy of the displacements in lateral or longitudinal directions should preferably be better than 10% or most preferably 2% of the target displacement.

BRIEF DESCRIPTION OF THE SEVERAL VIEWS OF THE DRAWING

Preferred examples of the present invention are described hereafter with reference to the following figures:

FIG. 14 illustrates the intensity profiles of illumination beams that may be alternatively employed in the ninth embodiment.

FIG. 15a-c illustrates masks that may be employed in the tenth embodiment.

DESCRIPTION OF THE INVENTION

Figure 1:
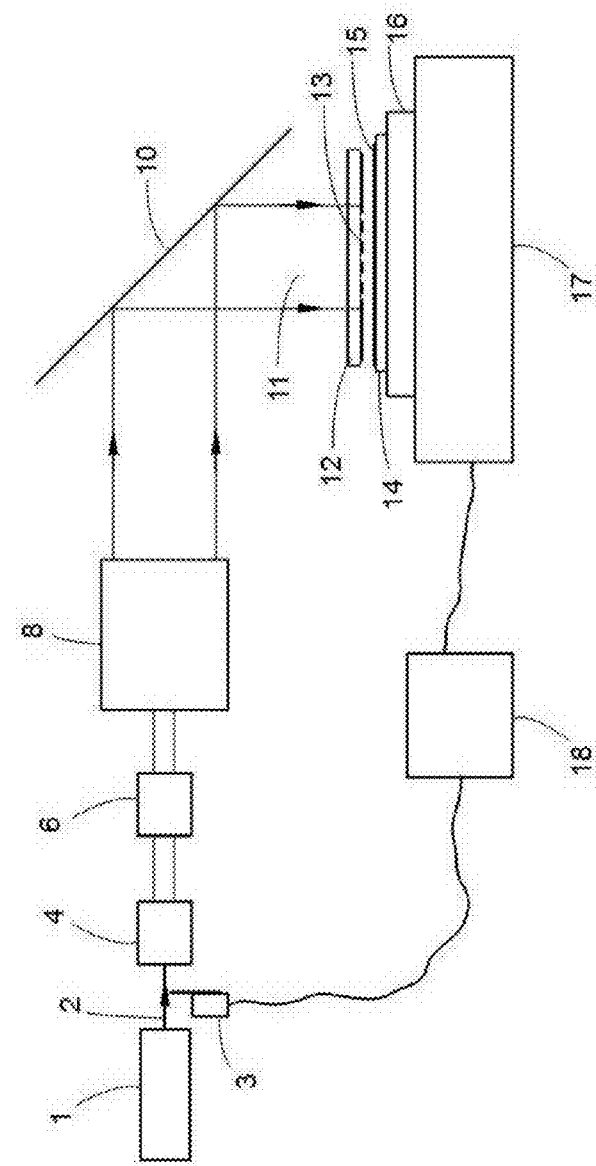
FIG. 1 illustrates an apparatus employed in the first, second and third embodiments of the invention.

With reference to FIG. 1, which shows a first exemplary embodiment of the invention, an argon-ion laser 1 emits a beam of substantially monochromatic light 2 with a wavelength 363.8 nm and a diameter ~2 mm, which is in TEM00 transverse mode so has a Gaussian intensity profile. The light is plane-polarized, the polarization vector being orthogonal to the plane of the diagram. After passing through an electronically operated shutter 3 the diameter of the beam 2 is enlarged by a beam expander 4 comprising a pair of lenses. The resulting enlarged beam of collimated light is incident on a beam-transformer 6, which converts the beam's Gaussian intensity profile into one that is substantially rectangular, so that the beam's intensity is substantially uniform across its central area. Such beam transformers are commercially available from, for example, Moltech GmbH (in particular, their piShaper product range). The homogenized beam of collimated light from the transformer 6 is incident on a second beam-expander 8 that enlarges the beam so that's the diameter of its uniform region is larger than the pattern to be exposed. This beam is reflected by a mirror 10 onto a mask 12 so that the mask 12 is illuminated at normal incidence by a well collimated light. On the underside surface of the mask is a one-dimensional periodic pattern 13, that is, a linear grating, that has a period of 600 nm composed of opaque lines and intermediate transparent spaces. The direction of the lines is orthogonal to the plane of the figure. The pattern 13 has been fabricated in a layer of chrome on a fused-silica substrate using standard electron-beam mask manufacturing technology. Whereas FIG. 1 shows only a few lines and spaces in the mask pattern 13, it should be understood that many more lines and spaces are present and that the dimension of the mask pattern is a number of centimeters. The mask 12 is rigidly mounted to a mechanical support (not shown in the diagram) such as a vacuum chuck.

Below the mask 12 is a wafer 14 with a layer of photoresist 15 that has been spin-coated to its upper surface. The layer 15 has a thickness of 11-Jm and the photoresist 15 is a standard i-line sensitive material. The wafer 14 is mounted to a vacuum chuck 16 that is attached to a positioning system 17 that includes both manual adjustment and fine-positioning actuators for tilting and changing the separation between the wafer and mask. The fine-positioning actuators are piezo-electric transducers (PZTs) with a travel range of 30 μm and have also integrated sensors that enable precise, closed-loop operation of the PZTs. The fine-positioning mechanism of the positioning system 17 also includes linear guides that ensure that the longitudinal displacement required of the wafer 14 during exposure is accurately orthogonal to the plane of the mask 12; specifically the guides ensure that the lateral displacement during exposure is less than 1/10 of the period of the pattern to be printed. The positioning system 17 and shutter 3 are controlled via a control system 18.

The wafer 14 is arranged parallel to, and with a separation of ~40 μm from, the mask 12 using the wafer positioning system 17 and also reference spacers which are employed to manually probe the gap between the mask 12 and wafer 14. The separation of the mask 12 and wafer 14 is arranged so that the blurring of those Talbot images or sub-images formed at or near the photoresist layer 15 caused by imperfect collimation of the illumination beam 11 is negligible with respect to the period of the printed pattern: preferably less than one tenth thereof. As is well known in the art, the magnitude of the blurring of such images may be estimated as the product of the angular divergence of the light illuminating any point of the mask pattern multiplied by the separation of the wafer and mask.

The wafer 14 is exposed using the following procedure. The laser shutter 3 is opened for a time needed so that the resulting exposure dose corresponds to approximately half of what would be needed in the absence of the mask 12 to fully remove the photoresist 15 from the exposed area of the wafer 14 following development. The illuminated grating 13 in the mask 12 produces three diffraction orders, a $0^{th}$ and two $1^{st}$ orders, which interfere to form Talbot images at periodic distances from the mask 12. The image planes are separated by the Talbot distance, which for the linear grating 13 and illumination wavelength concerned, is 1.78 μm. Since the separation and parallelism between the substrate 14 and mask 12 have not been accurately adjusted (and nor are the mask 12 and wafer 14 accurately flat), the photoresist 15 does not lie in a particular Talbot image plane, and so the intensity distribution that exposing the photoresist 15 is highly non-uniform. Indeed, it comprises a mixture of regions where the Talbot images are well-focused, partially focused or are entirely out of focus.

Following the first sub-exposure, the fine-positioning actuators in the positioning stage are employed to longitudinally displace the wafer 14 by a distance corresponding to half the Talbot distance, that is, by 0.89 μm. This displacement may be in the direction of either increasing or decreasing separation because, in view of the Talbot period of the Light-field from the mask 12, the resulting intensity distributions at the photoresist 15 are the same. Also equivalently, for the same reason, the wafer 14 may alternatively be displaced by a distance of (m+½) Talbot distances, where m is an integer (which may be positive or negative). Following the displacement, the wafer 14 is exposed in a second sub-exposure to the same exposure dose as before. Because of the longitudinal displacement of the wafer 14 between exposures, the intensity distribution illuminating the photoresist 15 is very different from that in the first sub-exposure. The effective, or net, intensity distribution that exposes the photoresist 15 during the two sub-exposures is the average of the two. Following the second sub-exposure, the wafer 14 is removed from the exposure apparatus and the photoresist 15 is developed using standard methods.

The result of this double-exposure procedure may be mathematically derived. If the mask grating 13 lies in the xy plane with its lines parallel to the y-axis, and the illumination is in the z-direction, then the total E-field formed by the three diffraction orders transmitted by the mask may be represented as:

$$E_T(x, y, z) = e^{\frac{-i2\pi}{\lambda}z} + A_1 e^{\frac{i2\pi}{\lambda}(z\cos\theta + x\sin\theta)} + A_1 e^{\frac{-i2\pi}{\lambda}(z\cos\theta - x\sin\theta)}$$

where A 1 is the amplitude of $1^{st}$ diffracted orders relative to 0th, and ±θ are the angles of the 1st diffraction orders.

The intensity distribution at a particular distance $z_0$ from the mask 12 is therefore $$I_T(x, y, z_0) = E_T E_T^* \qquad \text{equ. (1)}$$
$$= 1 + 4A_1^2\cos^2\left(\frac{2\pi x\sin\theta}{\lambda}\right) +$$
$$4A_1\cos\left(\frac{2\pi x\sin\theta}{\lambda}\right)\cos\left\{\frac{2\pi z_0(1-\cos\theta)}{\lambda}\right\}$$
$$= 1 + 4A_1^2\cos^2\left(\frac{2\pi x}{\Lambda}\right) + 4A_1\cos\left(\frac{2\pi x}{\Lambda}\right)\cos\left\{\frac{2\pi z_0}{L_T}\right\}$$

where $\Lambda$ is the period of the grating 13 and $L_T=\lambda/(1-\cos\theta)$ is the Talbot distance.

The intensity in a plane at a distance $(z0+Lr/2)$ from the mask 12 is correspondingly:

$$I_T\left(x, y, z_0 + \frac{L_T}{2}\right) = 1 + 4A_1^2\cos^2\left(\frac{2\pi x}{\Lambda}\right) - 4A_1\cos\left(\frac{2\pi x}{\Lambda}\right)\cos\left\{\frac{2\pi z_0}{L_T}\right\} \qquad \text{equ. (2)}$$

Therefore, the mean intensity distribution produced at the substrate 14 by longitudinally displacing it by $L_T/2$ between two exposures of equal dose is $$I_{mean}(x, y, z) = \frac{\left\{I_T\left(x, y, z + \frac{L_T}{2}\right)\right\}}{2} 1 + 4A_1^2\cos^2\left(\frac{2\pi x}{\Lambda}\right) \qquad \text{equ. (3)}$$

This result shows that the image printed into the photoresist 15 is independent of the initial separation of the wafer 14 and mask 12, and is a grating pattern with a period that is half of that of the mask pattern 13. In these respects, it is therefore similar to the ATL and DTL techniques and enables a grating pattern to be uniformly and reproducibly printed onto a substrate surface, even on substrates having poor surface flatness and into photoresist whose thickness is larger than the depth of focus of the Talbot image.

To optimize the pattern printed into the photoresist 15, the developed photoresist structure should be evaluated using standard techniques and then further photoresist-coated wafers printed using the same procedure but with optimization of the exposure dose for the two sub-exposures. This experimental procedure for determination of appropriate dose applies to all embodiments.

In a variant of this embodiment, the exposure sequence is repeated using the same or a different separation for the third sub-exposure, then changing the separation between the mask and wafer by half the Talbot distance (or m+½ Talbot distances) before a fourth sub-exposure, and employing the same exposure dose for fourth sub-exposure as for the third sub-exposure. Such a repeat sequence may be extended to six, eight, etc sub-exposures. The repeated sequence can relax the requirement on the accuracy with which the wafer should be displaced by half of the Talbot distance between two exposures, thereby enabling a more uniform and reproducible exposure. This repeated exposure procedure may also help to reduce interference effects due to light being reflected by the mask and substrate surfaces, the principle of which may be applied in other embodiments of the invention.

In another variant of the first embodiment, the exposure is instead divided into three sub-exposures and the separation between the wafer and mask is changed by ⅓ of the Talbot distance between the first and second sub-exposures and between the second and third sub-exposures, the changes of separation being in the same direction. Because the Light-field from the mask has a periodicity of the Talbot distance, the displacement of the wafer between sub-exposures may alternatively and equivalently be (m±⅓) Talbot distances, where m is an integer whose value may be different for the two displacements (and the sign of ⅓ is the same for the two displacements). The relative separations of the wafer and mask for the three sub-exposures with respect to the separation for the first sub-exposure, after subtracting or adding integral numbers of Talbot distances, may therefore be represented as n/3 of the Talbot distance, where n takes each of the values 0, 1 and 2. For each sub-exposure the mask is exposed to the same exposure dose, and the total dose is selected in order to produce the required structure in the developed photoresist. The exposure dose per sub-exposure may be subsequently optimised in exposures of other wafers.

In another variant, the exposure is instead divided into a larger number of sub-exposures, N, for example, 4, 5 or 6, and the separation between the wafer and mask is changed between the different sub-exposures by $L_T/N$, where the changes of separation are all in the same direction. Because the light-field from the mask has a periodicity of the Talbot distance, the displacement of the wafer between sub-exposures may alternatively and equivalently be $(m\pm 1/N)L_T$, where m is an integer whose value may be different for the different displacements, and the sign of 1/N is the same for all the displacements. Further, the sub-exposures do not need to be performed in the sequence implied by this formula but may be performed in any other sequence. For example, for the simple case that m=0 for all the changes of separation, the separation does not need to be changed by $L_T/N$ between all the sub-exposures. What is necessary is that the relative separations of the sub-exposures with respect to the first sub-exposure are given by n/N, where n takes each of the integral values from 0 to N−1, i.e. n does not also define the temporal sequence (except n=0 always corresponds to the first exposure). Expressing this requirement more generally, the relative separations of the mask for the three sub-exposures with respect to the separation for the first sub-exposure, after subtracting or adding integral numbers of Talbot distances, should be given by n/N of the Talbot distance, where n takes each of the integral values from 0 to N−1. For each of the sub-exposures the mask is exposed to the same energy density of illumination.

Although may not be preferred, any of the sub-exposures may be sub-divided, in another variant of this embodiment, into a set of sub-sub-exposures that are performed at the same separation as the sub-exposure and such that the summation of their exposure doses corresponds to that of the sub-exposure. The sub-sub-exposures, however, are not performed consecutively but are temporally interspersed between the various other sub-exposures (or sub-sub-exposures thereof). Since the sum of the exposure doses of a particular set of sub-sub-exposures is the same as the sub-exposure from which the set was derived, the set of sub-sub-exposures may be treated and considered as equivalent to the sub-exposure.

In the general case the mean intensity that illuminates the mask over the course of N sub-exposures of equal dose, in which the separation between the wafer and mask is changed by $L_T/N$ between successive sub-exposures (or equivalent), is given by:

$$I_{mean}(x, y, z) = \qquad\qquad \text{equ. (4)}$$
$$1 + 4A_1^2\cos^2\left(\frac{2\pi x}{\Lambda}\right) + 4A_1^2\cos\left(\frac{2\pi x}{\Lambda}\right)\sum_{m=0}^{N-1}\cos\left\{2\pi\left(\frac{z_0}{L_T} + \frac{m}{N}\right)\right\}$$

Irrespective of the value of N, the summation term equates to 0, and so the expression for $I_{mean}(x, y)$ reduces to the same distribution described by equ. (3). So, with N sub-exposures performed with this set of separations, the printed result is also insensitive to the initial separation between the mask 12 and wafer 14 and to their surface flatness, and therefore likewise enables the high-resolution pattern concerned to be printed uniformly and reproducibly.

Figure 2:
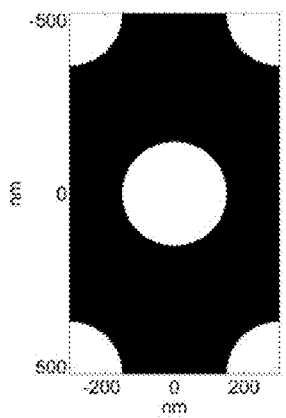
FIG. 2 shows the unit cell a mask pattern comprising a hexagonal array of holes that is employed in a second embodiment.

In a second embodiment of the invention, the same exposure apparatus as in the first embodiment is substantially employed except, firstly, a quarter-wave plate is included in the beam path between the shutter 3 and the beam expander 4, which circularly polarizes the exposure beam 11. Secondly, the mask 12 employed in the first embodiment is replaced by another mask, again labeled 12, that defines instead a pattern of holes in a chrome layer, again labeled 13. The holes are arranged on a hexagonal grid, as is illustrated by the rectangular unit cell of the lattice shown in FIG. 2. The diameter of the holes is 0.31 Jm and their nearest-neighbor distance is 0.6 μm. It is preferable that the beam illuminating a two-dimensional array is circularly rather than linearly polarized so that the diffraction of the light by the mask is the same in both xz and yz planes.

The same procedure as in the first embodiment is employed to arrange a wafer 14 parallel to and with the same separation of ~40 μm from the mask 12. Substantially the same double-exposure sequence is also employed except that the longitudinal displacement of the wafer between sub-exposures is 0.641 Jm, so as to again correspond to half the Talbot distance for the mask pattern 13 and wavelength concerned.

Figure 2A:
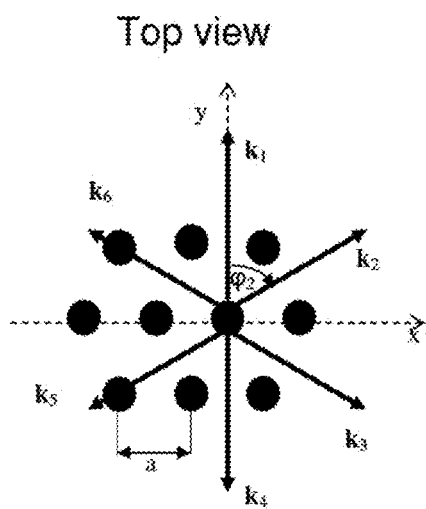
FIG. 2a shows the directions of diffraction orders in the plane of the mask.
Figure 2B:
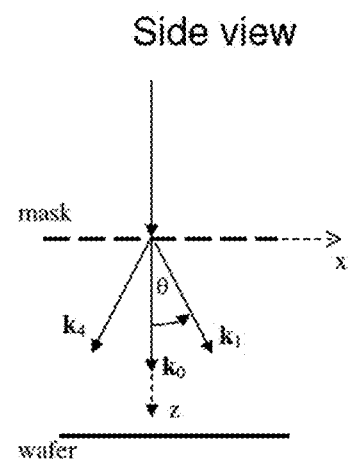
FIG. 2b shows the directions of diffraction orders in side view.

The result of the double exposure using the mask 12 with a hexagonal pattern 13 may again be theoretically determined. The hexagonal pattern of holes 13 produces a $0^{th}$ diffracted order and six $1^{st}$ orders. The directions of these orders are illustrated in FIGS. 2a and 2b, which show respectively the directions of the orders as viewed from above the mask 12 and a side-view thereof. FIG. 2a shows the six $1^{st}$ diffracted orders and assigns to them wavevectors k1, k2, . . . k6, and illustrates also the azimuthal angular components of the orders, $\phi_i$, with respect to the y axis in the xy plane. The nearest-neighbor distance, a, of the holes in the periodic pattern 13 is also indicated. FIG. 2b shows the $0^{th}$ diffracted order as well as the two 1st orders that are diffracted in the xz plane. The $0^{th}$ order is assigned the wave-vector $k_0$, and the polar angular component, θ, of all the $1^{st}$ orders is also indicated in the FIG. 2b. The amplitude, phase and unit polarization vector of the $0^{th}$ order are represented as $E_0$, $\omega_0$ and $\hat{e}_0$ respectively, and those of the ith $1^{st}$ order are represented as $E_i$, $\omega_i$ and $\hat{e}_i$ respectively.

The total E-field diffracted by the hexagonal array is described by:

$$E(r) = \Sigma_{i=0}^{6} \exp\{i(k_i \cdot r + \omega_i)\}\hat{e}_i,$$

From this it can be derived that the intensity distributions exposing the wafer 14 at a distance $z_0$ from the mask is given by $$I_{mean}(x, y, z_0) = \qquad\qquad \text{equ. (5)}$$
$$\sum_{i=0}^{6} E_i^2 + 2\sum_{i=1}^{6}\sum_{j>i}^{6} E_i E_j \cos\left[\frac{2\pi}{\lambda}\{x\sin\theta(\sin\varphi_i - \sin\varphi_j) + y\sin\theta(\cos\varphi_i - \cos\varphi_j)\}\right]\hat{e}_i \cdot \hat{e}_j +$$
$$2E_0\sum_{i=1}^{6} E_i \cos\left[\frac{2\pi}{\lambda}\{z_0(\cos\theta - 1) + x\sin\theta\sin\varphi_i + y\sin\theta\cos\varphi_i + \omega_i + \omega_0\}\right]\hat{e}_0 \cdot \hat{e}_i$$

If the wafer is displaced by half the Talbot distance, $L_T/2$, then the resulting intensity distribution at the wafer is given by the same expression except that the sign of the third term is negative. So, the average intensity distributions produced by displacing the wafer by half the Talbot distance is given by the first two terms of equ. (5), which are independent of $z_0$. Thus, the longitudinal displacement of half a Talbot distance between two sub-exposures of equal dose enables the hexagonal pattern to be printed uniformly and reproducibly onto substrates. Clearly, an alternative displacement between sub-exposures of (n+½) Talbot distances would be equivalent.

Figure 3:
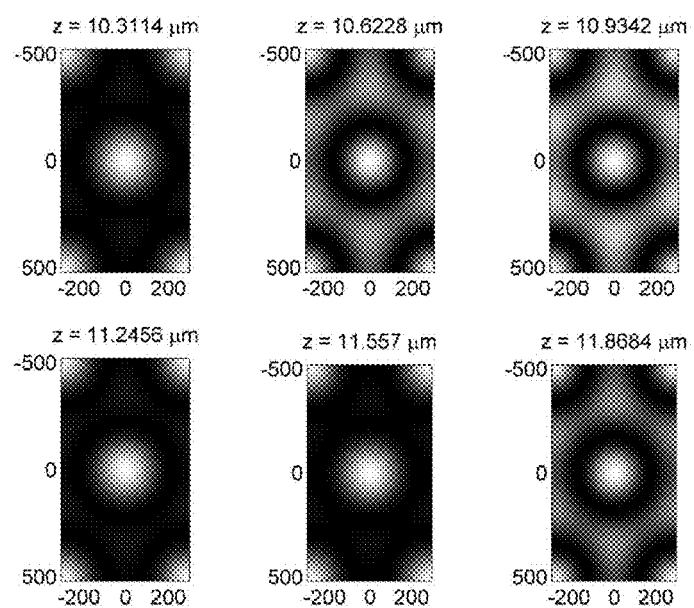
FIG. 3 shows computer simulation results of the intensity distribution calculated at different distances from the mask pattern of the second embodiment.
Figure 4:
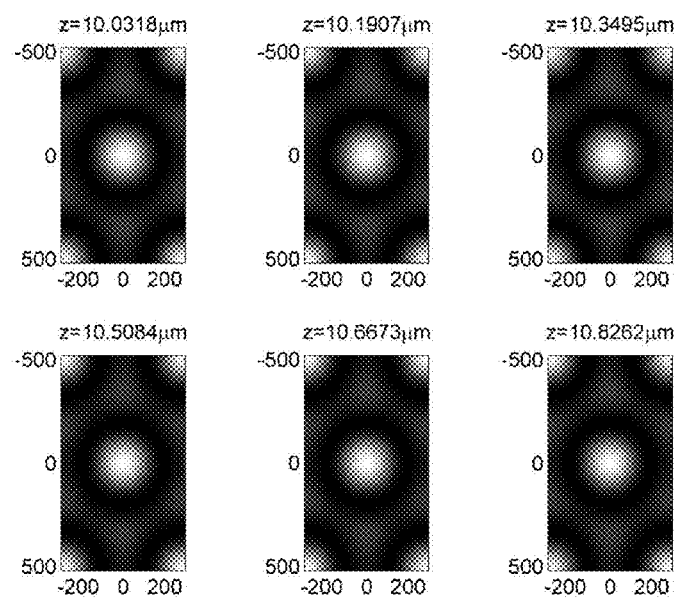
FIG. 4 shows computer simulation results of the average intensity distribution obtained at the wafer with a range of initial separations of the wafer and mask, when employing the mask and exposure procedure of the second embodiment.

The intensity distribution produced at different distances from the mask 12 may be simulated using software based on scalar diffraction theory that calculates the amplitudes and phases of the diffraction orders generated by the pattern 13 in the mask 12, and the interference between these orders as they propagate in the space between the mask 12 and wafer 14. Six examples of the intensity distributions determined at different distances between 10 and 12 μm from the mask 12 are illustrated in FIG. 3, each of which is the intensity distribution within a unit cell of the repeating hexagonal lattice. Note that this range is only selected as an example. Similarly strongly varying intensity distributions are present at other distances as well. The strong dependence of the intensity distribution on distance from the mask 12 and consequent limited depth of focus of the Talbot image planes are evident. The software is also employed to determine the effective, or average, intensity distribution produced by the double-exposure procedure employed in this embodiment. The results in FIG. 4 show the resultant intensity distributions at the wafer 14 as the initial separation between the wafer 14 and the mask 12 is varied between 10 and 11 μm.

The independence of the average distribution on the initial separation of the wafer 14 and mask 12 is clear, again demonstrating the equivalence of this exposure technique to ATL and DTL, thereby providing the same advantages as those techniques for printing a hexagonal pattern of features uniformly and reproducibly onto substrates.

In a variant of the first embodiment, first and second sub-exposures are first carried using the separations as described above. The separation is then changed to another value (different to that used for either the first or second sub-exposures) following which a third sub-exposure is performed. The separation is then changed by half the Talbot distance before performing a fourth sub-exposure. The exposure doses used for the first and second sub-exposures are the same and those used for the third and fourth sub-exposures are the same. Clearly, such an exposure sequence may be extended to six, eight, etc sub-exposures. A multi-sub-exposure sequence can relax the requirement on the accuracy with which the wafer should be displaced by half of the Talbot distance between two exposures, thereby enabling a more uniform and reproducible exposure.

In another variant, the exposure may be divided into 3 (or N) sub-exposures with the separation being changed by one third (or 1/N) of the Talbot distance between sub-exposures to produce the same resultant average intensity distribution at the wafer 14. This equivalent result produced by exposing with N sub-exposures in which the separation being changed by 1/N of the Talbot distance between sub-exposures is readily derivable from equ. (5), using the same approach described in the first embodiment. As for that embodiment the sub-exposures may be carried out in any sequence, so long as the relative separations of the mask 12 and wafer 14 during the sub-exposures with respect to the separation during the first sub-exposure are given by n/N, where n takes each of the integer values from 0 to N−1.

Also as for the first embodiment, any sub-exposure may alternatively be sub-divided into a set of sub-sub-exposures that are exposed with the same separation between the mask 12 and wafer 14 and with the same integrated dose as for the sub-exposure, but which are temporally distributed amongst the other sub-exposures (or sub-sub-exposures thereof). The set of sub-sub-exposures may likewise be considered as entirely equivalent to the sub-exposure from which it was derived.

Figure 5:
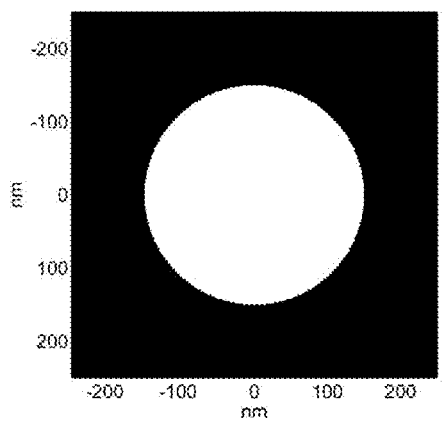
FIG. 5 shows the unit cell a mask pattern comprising a square array of holes that is employed in a third embodiment.

In a third embodiment of the invention, essentially the same exposure apparatus as in the second embodiment is employed except that the mask employed, again labeled 12, defines a pattern of holes, again labeled 13, in a chrome layer that are arranged on a square grid, as is illustrated by the unit cell of the lattice shown in FIG. 5. The diameter of the holes is 0.31 Jm and the period of the square lattice is 0.51 Jm.

Figure 6:
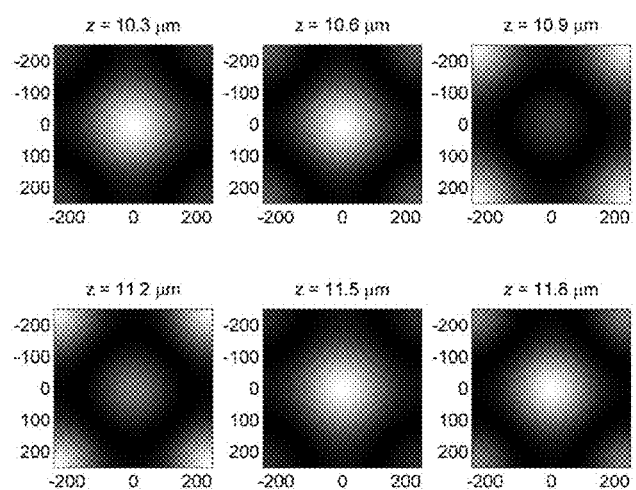
FIG. 6 shows computer simulation results of the intensity distribution calculated at different distances from the mask pattern employed in the third embodiment.
Figure 7:
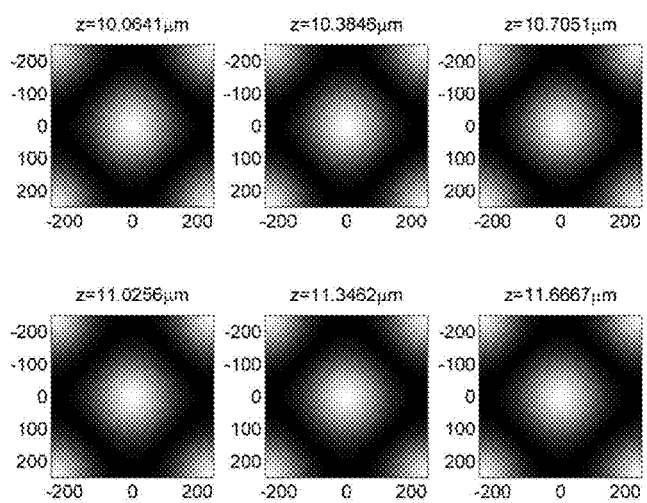
FIG. 7 shows computer simulation results of the average intensity distribution obtained at the wafer with a range of initial separations of the wafer and mask, when employing the mask and exposure procedure of the third embodiment.

The same procedure is employed to arrange the wafer 14 parallel and at the same separation of −401 Jm from the mask 12. Essentially the same exposure procedure as in the first embodiment is employed except that the longitudinal displacement of the wafer 14 between sub-exposures is 0.58 μm, so as to again correspond to half the Talbot distance for the pattern 13 and wavelength concerned. The intensity distribution produced at different distances from the mask 12 may be estimated using software based on scalar diffraction theory that simulates the propagation of the light through the mask 12 and the interference between the various diffracted orders after the mask 12. Examples of the intensity distribution calculated at different distances between 10 and 121 Jm from the mask 12 are shown in FIG. 6: each shows the intensity distribution in a unit cell of the repeating square lattice. The strong dependence of the intensity distribution and limited depth of focus of the Talbot image planes is again evident. The software is similarly employed to determine the effective, or mean, intensity distribution produced by the double exposure in which the wafer 14 is longitudinally displaced by half of the Talbot distance between the sub-exposures, and to determine its dependence on the initial separation between the mask 12 and wafer 14. The results are shown in FIG. 7 in which the initial separation between the wafer 14 and mask 12 is varied between 10 and 12 μm. It can be seen that the density of the intensity peaks is a factor of 2 higher than that of the holes in the mask 12, which corresponds to an increase in pattern resolution by a factor of √2. The results also show that the mean intensity distribution is independent of the initial separation of the wafer 14 and mask 12, thereby demonstrating the same advantage as DTL and ATL for printing square arrays of features uniformly and reproducibly onto substrates.

The alternative procedures described in the variants of the first and second embodiments may likewise be applied in variants of this embodiment.

In a fourth embodiment of the invention, a similar apparatus as that shown in FIG. 1 is employed except that the wafer positioning system 17 includes also a fine-positioning stage for displacing the wafer 14 laterally with respect to the mask 12. Specifically, a stage that has PZT actuators with a travel range of 100 μm, which are equipped with integrated sensors for closed-loop feed-back of the PZT position. The mask 12 employed is the same as that in the first embodiment, that is, a linear grating with a period of 0.6 μm. As in the first embodiment, the wafer 14 is firstly arranged so that it is parallel to the mask 12 and with a separation of, for example, 40 μm. A first sub-exposure is performed in the same manner as that earlier embodiment. The wafer 14 is then displaced laterally in a direction orthogonal to the lines of the grating 13 and by a distance of half of the grating period, that is, by 0.3 μm. Following this, a second sub-exposure is performed using the same exposure dose as for the first. Because of the lateral displacement of the wafer 14 between sub-exposures, the intensity illuminating each point of the photoresist 15 during the second exposure is very different from that during the first, and so the effective intensity distribution produced by the superposition of the two exposures is essentially the average of the two. The wafer 14 is subsequently removed from the exposure apparatus and the exposed photoresist 15 developed.

The result of this double-exposure procedure may be mathematically derived. As in the first embodiment, the intensity distribution in a plane at a particular distance $z_0$ from the mask is given by equ. (1). For the second sub-exposure, the lateral displacement of the wafer by 1∨2 in the x-direction is equivalent to the mask being displaced by −1∨2 in the x direction (with the wafer remaining fixed with respect to the xyz coordinate system), and so the resulting intensity distribution at the wafer is $$I_{Total}\left(x - \frac{\Lambda}{2}, y, z_0\right) = \qquad \text{equ. (5)}$$
$$1 + 4A_1^2\cos^2\left(\frac{2\pi x}{\Lambda}\right) - 4A_1\cos\left(\frac{2\pi x}{\Lambda}\right)\cos\left(\frac{2\pi z_0}{L_T}\right)$$

This distribution is the same as that described by equ. (2) in the first embodiment, and so the average intensity distribution produced by the two sub-exposures is also given by equ. (3), and therefore is independent of $z_0$. Consequently, the effective exposure produced by a double-exposure of a linear grating, in which the wafer 14 is laterally displaced with respect to the mask 12 by half of the grating period in a direction orthogonal to the lines, is likewise equivalent to an ATL or DTL exposure and provides the same advantages as those techniques.

In view of the continuous, uniform nature of the grating lines along their length, it is not necessary that the lateral displacement be performed in a direction that is exactly orthogonal to the lines. What is important is the component of the displacement in the direction orthogonal to the lines is half of the grating period.

In view of the periodicity of the mask pattern in the direction orthogonal to the grating lines, the same result can be equivalently obtained by displacing the mask relative to the wafer by a distance whose component in the direction orthogonal to the lines is given by $(m \pm \frac{1}{2})$ grating periods, where m is an integer. It is advantageous though that m is small and preferably 0, in order to minimize any longitudinal displacement, or change of separation, that simultaneously occurs with the lateral displacement. A change in longitudinal separation also modifies the intensity distribution exposing the wafer and so distorts the average exposure. Preferably, the change in separation should be less than a $\frac{1}{10}$ of the Talbot distance.

Figure 8:
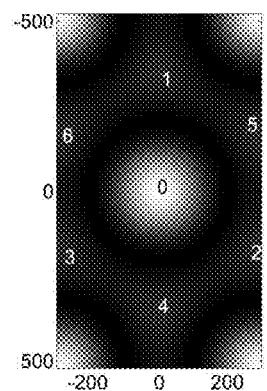
FIG. 8 shows a computer simulation of the intensity distribution in a Talbot image plane of a hexagonal array mask employed in the fifth embodiment.

In a fifth embodiment of the invention, the same apparatus as in the fourth embodiment (as illustrated in FIG. 1) is employed except that a quarter-wave plate is included in the beam path between the shutter 2 and beam-expander 3, which circularly polarizes the light incident on the mask 12. Secondly, the mask pattern 13 is the same as that employed in the second embodiment, that is, a hexagonal pattern of holes in an opaque layer with diameter 0.3 µm and nearest-neighbor distance of 0.6 µm. FIG. 8 shows the intensity distribution of a unit cell of an image plane generated by the illuminated mask 12, as calculated using simulation software. It shows a strong intensity peak, labeled "0", at the centre of the distribution and four other strong peaks at the corners of the unit cell. The distribution of the strong peaks in the image plane is therefore the same as the distribution of features in the mask, that, is a hexagonal array with the same period. FIG. 8 shows also six weaker "secondary peaks", labeled "1" to "6", which are located at the vertices of a hexagon around the central peak. Each vertex is, in fact, centered on three neighboring strong peaks and is therefore equidistant between the three. It should further be noted that each of secondary peaks 4, 5 and 6 is equidistant from three main peaks located at the vertices of a triangle having an upright orientation in the distribution, whereas each of secondary peaks 1, 2 and 3 is equidistant from three main peaks located at the vertices of a triangle having an inverted orientation in the distribution. The intensities at secondary peaks 1 to 6 are the same.

For ease of explanation, let us assume that the separation between the mask 12 and wafer 14 is initially arranged for exposing the photoresist 15 to the image intensity distribution shown in FIG. 8. The wafer 14 is exposed to this distribution for an exposure time so that the resulting energy density is approximately one third of what would be needed in the absence of the mask 12 to fully expose the thickness of photoresist 15. Let us now consider the location on the wafer 14 that is illuminated by the main peak "0" in the first sub-exposure. Following the sub-exposure, the wafer 14 is translated laterally, using the positioning stage 17, by a distance and in a direction so that this location will instead be aligned with the centre of secondary peak "3" in a second sub-exposure. The second sub-exposure is performed using the same energy density as employed in the first. Following this, the wafer 14 is translated laterally again, this time by a distance and in a direction so that the same location on the wafer 14 will instead be aligned with the centre of secondary peak "5" in a third sub-exposure. The third sub-exposure is performed using the same energy density as employed in each of the first two.

Figure 9:
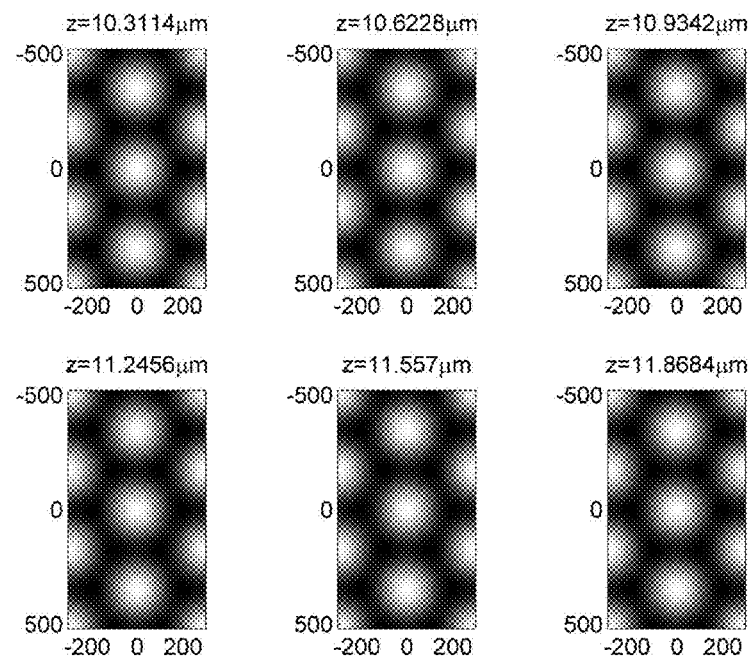
FIG. 9 shows computer simulation results of the average intensity distribution obtained at the wafer with a range of initial separations of the wafer and mask, when employing the mask and exposure procedure of the fifth embodiment.

The effective, or average, intensity distribution resulting from the three superposed sub-exposures and its dependence on the separation of the mask 12 and wafer 14 may be derived from equ. (5) or using simulation software. Simulation results illustrating the average distribution and its dependence on the separation, which is varied between 10.3 and 11.9 µm, are shown in FIG. 9. As can be seen, the average intensity distribution contains a periodic pattern of peaks of equal intensity whose period is 3 smaller than that of the pattern in the mask, and secondly this distribution is independent of the mask-to-wafer separation. Consequently, it is unnecessary that the wafer 14 is initially positioned at the image distribution shown in FIG. 8, but may be at any distance from the mask 12 (though respecting the limit imposed by blurring caused by imperfect collimation of the illumination beam, as described earlier). Thus, this embodiment also enables a high-resolution hexagonal-array pattern to be printed uniformly and reproducibly onto wafers.

For this embodiment it is important is that the lateral displacements of the intensity distribution relative to the wafer 14 between sub-exposures correspond to those disclosed above, or to the equivalent. Concerning the latter, the equivalence of secondary peak positions 1, 2 and 3 (as noted above) means that the displacement of the wafer 14 before the second sub-exposure may alternatively be so that the location concerned on the wafer is exposed to either of secondary peaks 1 and 2 rather than to peak 3. Likewise, after the second sub-exposure to secondary peak 3, the wafer may alternatively be displaced so that the location concerned on the wafer is exposed to either of secondary peaks 4 and 6 rather than to peak 5.

In view of the periodicity of the mask pattern 13, it is evident that in other variants of this embodiment, the displacement of the wafer 14 between sub-exposures may be by any of the above-described values plus any integer number of unit cells of the pattern in each of the x and y directions. In order to minimize possible change of separation of the mask 12 and wafer 14 caused by the lateral displacement, it is however preferable that the magnitude of the lateral displacements between sub-exposures are minimized. Preferably the change in separation between sub-exposures is <0.1 times the Talbot distance and most preferably less than 0.02 times the Talbot distance.

The variety of equivalent displacements that may be employed between sub-exposures in this embodiment may therefore be described in the following way. The displacement between the first and second sub-exposures should be by a distance and in a direction that correspond to a vector between a feature in the mask pattern 13 and a point in the mask pattern 13 that is equidistant between three neighboring features in the mask pattern 13. The displacement between the second and third exposures should be by a distance and in a direction that correspond to a vector between a mask feature and a second point in the mask pattern 13 that is equidistant between a second three neighboring mask features. Lastly, the second three neighboring features in the mask pattern should be selected so that they cannot be transposed to the first three neighboring features by a translation operation alone (a rotation is also required).

Figure 10:
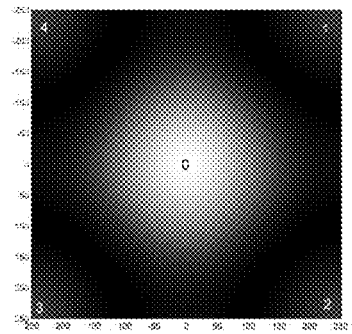
FIG. 10 shows a computer simulation of the intensity distribution in a Talbot image plane of a square array mask employed in the sixth embodiment.

In a sixth embodiment of the invention, the same apparatus as in the fourth embodiment is employed except that the mask 14 is the same as that used in the third embodiment, that is, a pattern of holes in an opaque layer that are arranged on a square grid, whose diameter and period are respectively 0.3 µm and 0.5 µm respectively. FIG. 10 shows the intensity distribution in a unit cell of an image plane generated by the illuminated mask 12, as calculated using simulation software. It shows a strong intensity peak, labeled "0", at the centre of the distribution and four weaker "secondary peaks", labeled "1" to "4" centered on the four corners of the unit cell. Each one of the secondary peaks is located at equal distance to four strong intensity peaks like the one shown with 0 in the figure. Note that these peaks are difficult to observe in some image planes but their positions at the corners of the unit cell may be more easily seen in FIG. 7.

Figure 11:
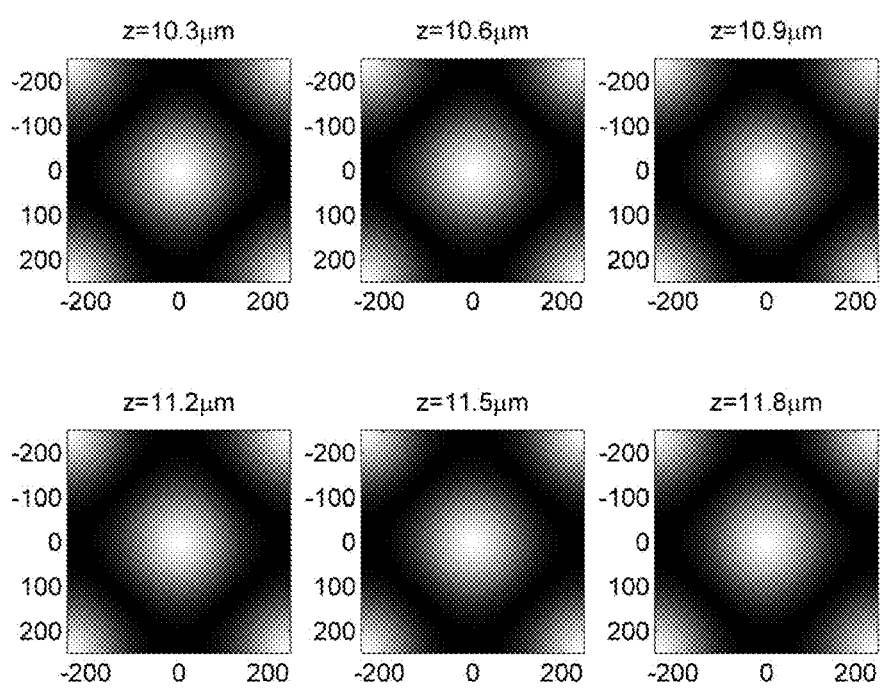
FIG. 11 shows computer simulation results of the average intensity distribution obtained at the wafer with a range of initial separations of the wafer and mask, when employing the mask and exposure procedure of the sixth embodiment.

As for the previous embodiment, let us assume that the separation between the mask 12 and wafer 14 is initially arranged so that the photoresist is exposed to an image in the Light-field transmitted by the mask 12. A first sub-exposure is carried out using approximately the exposure dose that would be required, in the absence of the mask 12, to fully expose the thickness of the photoresist 13. Let us consider that the first exposure illuminates a particular location of the wafer 14 with the intensity distribution shown in FIG. 10. Following this sub-exposure, the wafer 14 is then laterally displaced using the positioning stage 17 in a direction and by a distance such that the particular location on the wafer 14 that was exposed to the centre of the main peak 0 is then aligned with the centre of any of secondary peaks 1-4 for the second sub-exposure. The wafer 14 is then exposed in a second sub-exposure using the same exposure dose as in the first. The effective, or average, intensity distribution resulting from the two superposed exposures and its dependence on the separation of the mask 12 and wafer 14 may be calculated using simulation software. Results are shown in FIG. 11, in which the intensity distributions are calculated at separations varying from 10.3 to 11.8 µm. As can be seen, the average intensity distribution contains a peak at the centre of the unit cell and peaks of the same intensity at each of the four corners of the cell. It can be concluded that the density of the intensity peaks in the average distribution is twice that as the holes in the mask, which corresponds to a factor $\sqrt{2}$ increase in feature resolution. The results also show that the resultant intensity distribution is independent of the initial separation between the mask 12 and wafer 14, and so this embodiment enables a high-resolution square-array pattern to be printed uniformly and reproducibly onto wafers.

In view of the periodicity of the mask pattern 13, it is evident that in other variants of this embodiment, the displacement of the wafer 14 between sub-exposures may be by any of the above-described values plus any integer number of unit cells of the pattern in each of the x and y directions. In order to minimize possible change of separation of the mask 12 and wafer 14 caused by the lateral displacement, it is however preferable that the magnitude of the lateral displacement between sub-exposures is minimized. Preferably the change in separation between sub-exposures is <0.1 times the Talbot distance and most preferably less than 0.02 times the Talbot distance.

As in the fifth embodiment, a variety of equivalent displacements may therefore be employed between the first sub-exposures, which may be expressed as follows. The displacement between the two sub-exposures should be by a distance and in a direction that correspond to a vector between a feature in the mask pattern 13 and a point in the mask pattern 13 that is equidistant between four neighboring features in the mask pattern 13.

Figure 11A:
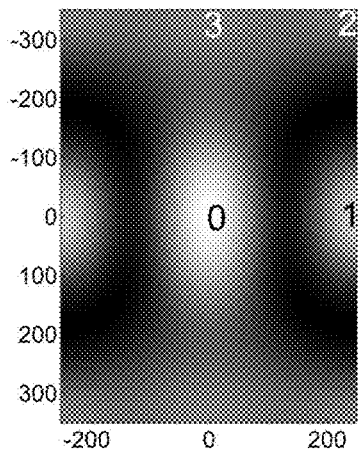
FIG. 11a shows top-down and side views of a mask employed in a seventh embodiment.

In a seventh embodiment, the same apparatus as in the fourth embodiment is employed except that a mask 14 is used that has a pattern of holes in an opaque layer, which are arranged on a rectangular grid. The diameter of the holes is 0.3 µm, and they are arranged on a rectangular grid that has a period of 0.5 µm in x and 0.7 µm in y. FIG. 11a shows the intensity distribution in a unit cell of an image plane generated by the illuminated mask 12, as calculated using simulation software. It shows a strong intensity peak, labeled "0", at the centre of the distribution, weaker secondary peaks centered on the left and right edges of the unit cell and weaker intensity areas across the top and bottom of the cell. The centre of the secondary peak at the left of the cell is labeled 1, the top-right corner and centre of the top edge in the weaker intensity area are labeled respectively 2 and 3.

As for the previous embodiment, let us assume that the separation between the mask 12 and wafer 14 is initially arranged so that the photoresist is exposed to an image in the Light-field transmitted by the mask 12. A first sub-exposure is carried out using approximately one quarter of the exposure dose that would be required, in the absence of the mask 12, to fully expose the thickness of the photoresist 13. Let us consider that the first exposure illuminates a particular location of the wafer 14 with the intensity distribution shown in FIG. 11a. Following this sub-exposure, the wafer 14 is then laterally displaced using the positioning stage 17 in a direction and by a distance such that the particular location on the wafer 14 that was exposed to the centre of the main peak 0 is then aligned with the position 2 in the distribution illustrated in FIG. 11a. The wafer 14 is then exposed in a second sub-exposure using the same exposure dose as in the first. The wafer 14 is then laterally displaced again, this time in a direction and by a distance such that the location that was exposed to the centre of the main peak 0 in the first sub-exposure is then aligned with the centre of secondary peak 1 in the intensity distribution. The wafer 14 is then exposed in a third sub-exposure using the same exposure dose as in the first. The wafer 14 is laterally displaced once more, this time in a direction and by a distance such that the location that was exposed to the main peak 0 in the first sub-exposure is then aligned with the position 3 in the intensity distribution shown in FIG. 11a. The wafer 14 is then exposed in a fourth sub-exposure using the same exposure dose as in the first.

Figure 11B:
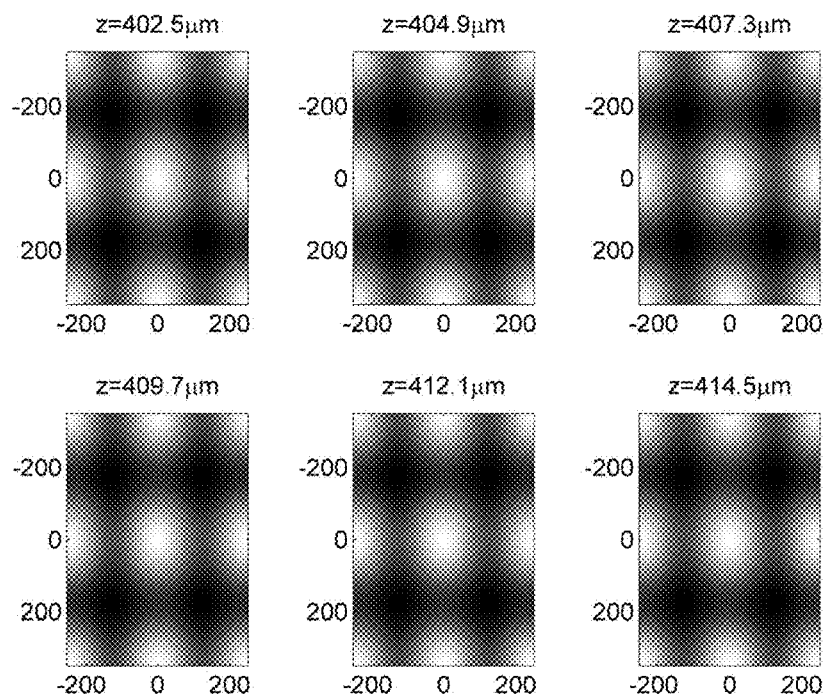
FIG. 11b shows computer simulation results of the average intensity distribution obtained at the wafer with a range of initial separations of the wafer and mask, when employing the mask and exposure procedure of the seventh embodiment.

The effective, or average, intensity distribution resulting from the two superposed exposures and its dependence on the separation of the mask 12 and wafer 14 may be calculated using simulation software. Results are shown in FIG. 11b, in which the intensity distributions are calculated at separations varying from 10 to 121-Jm. As can be seen, the average intensity distribution contains a peak at the centre of the unit cell and peaks of the same intensity at each of the four corners of the cell and also at centres of the four sides. It can be concluded that the density of the intensity peaks in the average distribution is four times that of the holes in the mask, which corresponds to an increase in feature resolution in both directions of a factor 2. The results further show that the resultant intensity distribution is independent of the initial separation between the mask 12 and wafer 14, and so this embodiment enables a high-resolution rectangular-array pattern to be printed uniformly and reproducibly onto wafers.

In view of the periodicity of the mask pattern 13, it is evident that in other variants of this embodiment, the displacement of the wafer 14 between sub-exposures may be by any of the above-described values plus any integer number of unit cells of the pattern in each of the x and y directions. In order to minimize possible change of separation of the mask 12 and wafer 14 caused by the lateral displacement, it is however preferable that the magnitude of the lateral displacement between sub-exposures is minimized. Preferably the change in separation between sub-exposures is <0.1 times the Talbot distance and most preferably less than 0.02 times the Talbot distance.

The variety of equivalent displacements that may be employed between sub-exposures in this embodiment may therefore be described in the following way. The displacement between the first and second sub-exposures should be by a distance and in a direction that correspond to a vector between a feature in the mask pattern 13 and a point in the mask pattern 13 that is equidistant between four neighboring features in the mask pattern 13. The displacement between the second and third sub-exposures should be by a distance and in a direction that correspond to a vector between a mask feature and a second point in the mask pattern 13 that is equidistant between a first pair of neighboring mask features. The displacement between the third and fourth sub-exposures should be by a distance and in a direction that correspond to a vector between a mask feature and a second point in the mask pattern 13 that is equidistant between a second pair neighboring mask features. The directions of offset of the features in the first and second pairs should be mutually orthogonal.

The displacements of the intensity distribution between sub-exposures that are described in the above fourth to seventh embodiments may be alternatively produced by displacing the mask instead of the wafer. For this purpose, the mask should be instead held in a vacuum chuck and mounted to a fine positioning stage with actuators such as piezo-electric transducers for translating the with respect to the wafer by the required distance(s) and in the required direction(s) between sub-exposures.

Figure 11C:
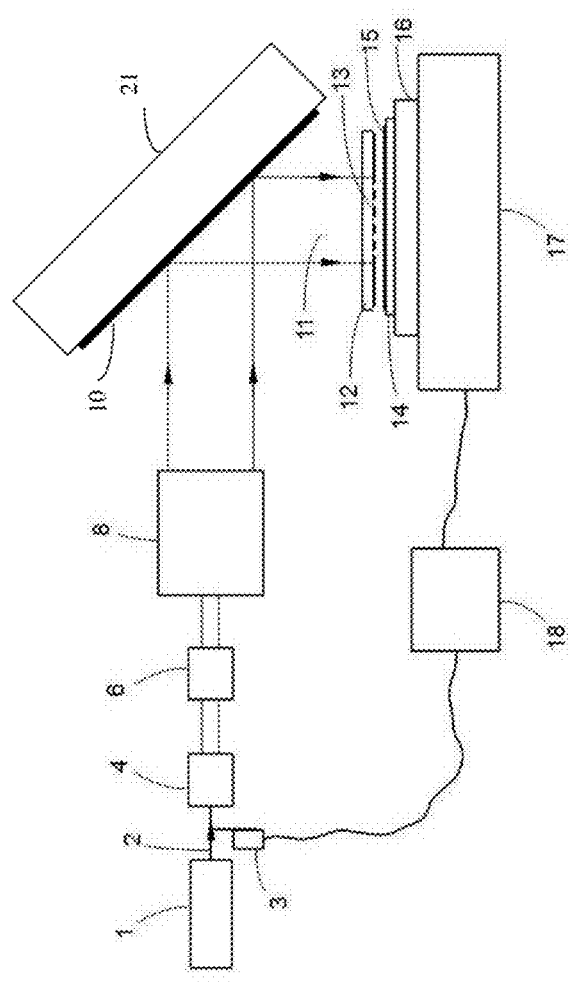
FIG. 11c illustrates an apparatus employed in the eighth embodiment.

The displacements of the intensity distribution between sub-exposures that are described in the above fourth to sixth embodiments may be further alternatively produced by changing the angle of the illumination beam between sub-exposures in an eighth embodiment. An apparatus for achieving this is illustrated in FIG. 11c. This system is substantially the same as FIG. 1 except that the mirror that reflects the collimated beam to the mask is mounted to a stage 21 that has actuators that enable the mirror 10 to be tilted in orthogonal planes. Tilting the mirror changes the angle of incidence of the beam at the mask. If the separation of the mask and wafer is L then an angular displacement $\Delta\theta_x$, $\Delta\theta_y$ of the illumination beam in the xz and yz planes causes the intensity distribution illuminating the wafer to displace by distances $L\Delta\theta_x$, $L\Delta\theta_y$ in the x and y directions respectively. The apparatus may include additional means (not shown in FIG. 11c) for measuring the separation so that the target separation L can be obtained with sufficient accuracy. An interferometric measurements system can be used for this purpose. This dependence enables the mirror to be tilted by the required amount between sub-exposures for producing the desired displacement of the intensity distribution between sub-exposures. In other related embodiments using different illumination optics, the change in angle of the illumination beam could be produced in other ways, as could be readily determined by a person skilled in optics. Similarly, using different illumination optics, multiple beams simultaneously illuminating the mask at different required angles can be produced. Examples of suitable illumination optics are illustrated and described in U.S. patent application Ser. Nos. 12/706,081 and 13/218,567.

In all the embodiments it is further preferable that the distance between the mask and wafer is oscillated by a distance of at least $\lambda/4$ during each of the sub-exposures in order to suppress possible non-uniformities in the printed pattern caused by interference of light that is double-reflected between the mask and wafer, and due to the spatially varying separation between the mask and wafer.

Whereas in all the above embodiments the same laser source is employed, in other embodiments of the invention other laser sources emitting at other wavelengths in the same or other spectral regions (such as deep-UV) may be alternatively employed in combination with suitable optics, masks and photoresists. Furthermore, it is not necessary that the laser source emit continuous-wave (CW) light but may emit the light in pulses. Using the latter type of laser, the number of pulses for each of the sub-exposures are preferably arranged to be the same. Other substantially monochromatic light sources may be alternatively be used, such as EUV sources, or a discharge lamps (e.g. mercury/xenon) whose output is spectrally filtered to a single narrow line.

Whereas in all the above embodiments, the same beam-forming system is employed to convert the Gaussian intensity profile of the beam emitted by the particular laser selected into a substantially uniform intensity beam for illuminating the mask, in other embodiments of the invention other beam-forming optics may be employed to transform a Gaussian or other intensity emitted by the laser so as to produce a sufficiently uniform exposure of the printed pattern onto the wafer or substrate. For example, a scanning system, light-pipe or an array or arrays of micro-lenses may be alternatively employed.

Whereas in the first to sixth embodiments described above it is stated that the doses used for the second (and third) sub-exposures is/are the same as for the first sub-exposure, to achieve optimal results some experimental fine-tuning, or optimization, of the relative dose(s) of the second (and third) sub-exposures may be additionally performed so as to compensate for small changes to the photochemistry and/or sensitivity of the photosensitive layer that is produced by the first sub-exposure.

Whereas the features in all the above embodiments in which the patterns are two-dimensional arrays are holes, in other embodiments the openings in the chrome are not restricted to circular shape but may be, for example, square. Further, each feature in the periodic pattern is not necessarily restricted to a single opening in the chrome but may be two or more openings, the group of which is periodic across the pattern. Alternatively, the feature is not necessarily a hole in chrome but may be the opposite polarity, i.e. a chrome feature with a surrounding transparent area in the unit cell.

Figure 12:
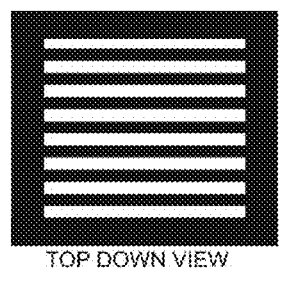
FIG. 12 illustrates the top and side views of a mask employed in the ninth embodiment of the invention.
Figure 12:
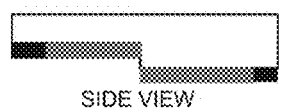

In the ninth embodiment, with reference to FIG. 12, schematic top-down and side views of a mask are shown for printing a linear grating. The regions on the right and left hand side of the mask carry linear gratings that are shifted by one half the Talbot period in the direction normal to the mask surface, that is there is a height step on the patterned surface of the mask. The grating lines lie perpendicular to this height step in the mask. The linear gratings on the right and left sides of the step have substantially the same optical properties and they may comprise opaque linear features, partially opaque linear features, phase shifting linear features or any combination of such features. Additionally the linear features have the same phase along the direction parallel to the edge, as schematically shown in the top-down view in FIG. 12, i.e. the features on one side seem to be a continuation of the features on the other side notwithstanding the height step in between. The linear features may continue practically all the way to the step, or there may be a zone of certain width on either side of the edge that 28 is opaque. The period of the linear gratings is chose such that only 0th and 1st diffraction orders have significant power.

Figure 13:
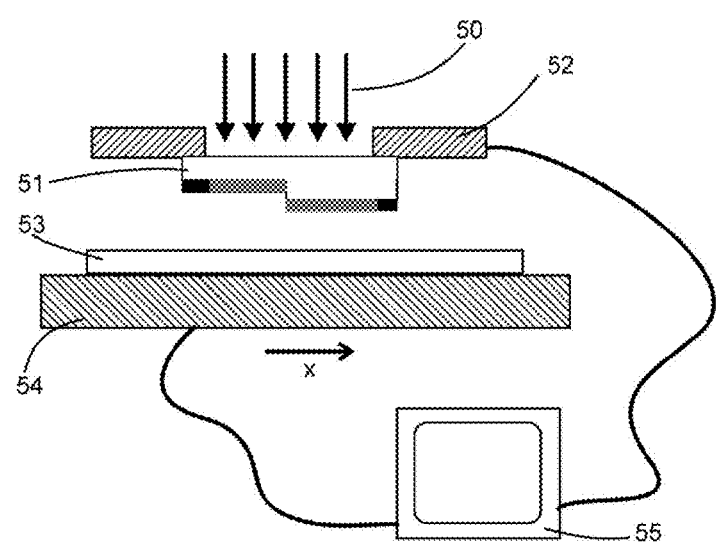
FIG. 13 illustrates an apparatus employed in the ninth embodiment.

An exposure apparatus using the mask shown in FIG. 12 for printing a linear grating on a photoresist coated substrate is illustrated in FIG. 13. The grating on the mask 51 is illuminated with a collimated beam of light 50 while the substrate is scanned in a direction x that is parallel to the lines of the mask grating. A photoresist coated substrate 53 is mounted on a holder 54 that is motorized to move the substrate in the direction x. In addition, the holder 54 is equipped with sensors that measure the changes in the position and orientation of the holder in all directions during the motion. The motion of the holder 54 and its sensors are controlled by a controller 55. As the substrate is scanned under the illuminated mask, each point on the substrate is exposed to sum of two intensity distributions that are shifted by one half of the Talbot period in the direction away from the mask relative to each other. This method is equivalent in principle to a double exposure scheme where the mask-substrate distance is changed by one-half of the Talbot period between two stationary exposures. The step fabricated into the mask along with the scanning action facilitates printing over large areas with a limited size illuminating beam and mask. The substrate motion and mask position are controlled through sensors, actuators and electronic circuitry in holders 52 and 54 and controller 55 so that the relative displacement of the two in the direction perpendicular to the lines in the mask is small with respect to the period of the printed grating. This is necessary in order not to blur the printed image and is achieved by back-feeding of the sensor information from the holder 54 to the actuators on the holder 52 by the controller 55. For example, depending on the application, one may require the relative motion of a point on the substrate 53 in the direction perpendicular to the lines as it passes under the illuminated region is smaller than 0.1 ʌ or 0.02ʌ, where ʌ is the period of the grating mask. The speed of the substrate motion is adjusted in order to deliver the required dose depending on beam intensity, mask transmission and photoresist sensitivity as well as optical properties of the substrate surface. It should be noted that distance between the mask and the substrate as measured along one of the lines of the grating should be determined primarily by the step fabricated into the mask; so that the average intensity distribution of two planes separated by one-half Talbot length can be printed on the substrate. Other variations, such as a relative tilt in the said direction should not change the distance on a scale of the Talbot length. For example, one may require the variations due to such extraneous factors (e.g. a tilt or bend of mask or substrate) to be less than 0.1 $L_T$ or 0.01 $L_T$. Variations of the mask-substrate distance in the direction orthogonal to the lines of the mask larger than the Talbot length do not have a similar degrading effect on the printed image. Similarly, as a point on the substrate passes through the illuminated region, its distance to the mask surface should not vary more than 0.1 $L_T$ or 0.01 $L_T$, excluding the effect of the step in the mask. Sensors on substrate holder 54 and actuators on mask holder 52 are used by the controller 55 to maintain the separation as defined by this riterion. In other embodiments, the linear grating mask may comprise 2, 3 or generally N height steps so that an exposure equivalent to the embodiments explained before where the separation between the mask and the wafer is varied by 1/N of the Talbot length, is obtained. For example, the mask may comprise three regions with two intermediate height steps of height $L_T/3$. In addition, one may add an integer number of Talbot lengths to the step height without affecting the outcome.

The space between the mask and the substrate may be filled with an immersion liquid in order to increase the contrast and resolution of printed images.

A grating mask of the type shown in FIG. 12 may be illuminated according to any of the schemes illustrated in FIG. 14. It may be illuminated with a beam that has a uniform intensity distribution along the lines of the gratings, as schematically shown in FIG. 14(a). Alternatively, the illuminating beam may have a smoothly changing intensity distribution, e.g. like a Gaussian as schematically shown in FIG. 14(b). Use of such a smoothly changing intensity distribution may facilitate the design of the illuminating optics or it may help avoid interference effects near the edges of the beam. The alternative illumination profile shown in FIG. 14(c) avoids the illumination of the step between the two halves of the grating. In this way undesired interference effects due to the illumination of the step discontinuity can be avoided.

Figure 15B:
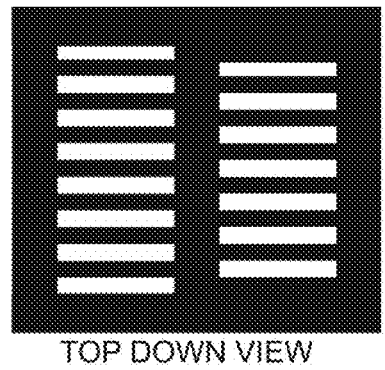
Figure 15B:
Figure 15C:
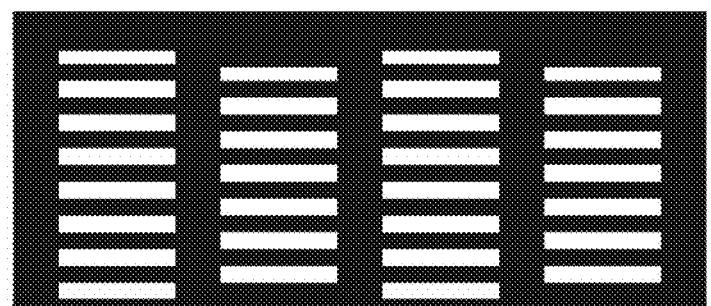
Figure 15C:

In the tenth embodiment the mask design illustrated by the schematic top-down and side views shown in FIG. 15a is employed to print a linear grating. The regions on the right and left hand side of the mask carry gratings that are laterally shifted by half the period of the grating. This mask is used in the scanning exposure apparatus shown FIG. 13. As the substrate passes under the illuminated mask, an average intensity distribution that is equivalent to the one explained in the fourth embodiment is delivered to the substrate ensuring a uniform printing of a grating that has half the period of the gratings on the mask. Various exemplary mask designs ensuring summation of two intensity distributions that are shifted by half the mask grating period in the direction orthogonal to the grating lines are illustrated in FIG. 15a-c. Various illumination schemes similar to the ones shown in FIG. 14 may be employed to ensure a uniform exposure. Likewise motion and position controlling procedures as explained for the use of the apparatus in FIG. 13 in the ninth embodiment also may be used in conjunction with the use of the masks illustrated in FIG. 15a-c in order to avoid degratdation and blurring of the printed image.

The invention claimed is:

1. A method for printing a desired one-dimensional or two-dimensional periodic pattern of features into a photosensitive layer, which method comprises the steps of:
   providing a mask bearing a periodic mask pattern of features;
   providing a substrate bearing the photosensitive layer;
   disposing the substrate substantially parallel to and with a separation from the mask;
   forming a beam of collimated monochromatic light for illuminating the periodic mask pattern of features so that a light-field transmitted by the mask forms Talbot image planes separated by a Talbot distance;
   performing N sub-exposures of the mask with the beam and changing a separation between the N sub-exposures such that a relative separation during an ith sub-exposure with respect to that during a first sub-exposure is given by (mi+ni/N) times the Talbot distance, where mi is an integer and ni takes each of the integer values from 0 to N−1 for different sub-exposures, wherein a period is selected in relation to a wavelength of illumination so that substantially only a zeroth and first diffraction orders are transmitted by the mask.

2. The method according to claim 1, which further comprises setting an intensity of the illumination beam to be a same for every sub-exposure, and an exposure time is a same for every said sub-exposure.

3. The method according to claim 1, wherein the beam continuously illuminates the mask during the sub-exposures and changes of separation, and a time taken for each change of separation is substantially smaller than a time taken for each said sub-exposure.

4. The method according to claim 1, wherein:
N=2 and a periodic pattern in the mask is composed of two regions of linear grating either side of a step in a patterned surface of the mask, a height of a step producing a shift of one half of a Talbot period between the two regions of linear grating in a direction normal to the mask; and
a change of separation for exposing each point of the photosensitive layer in the second sub-exposure is obtained by illuminating the two regions of linear grating with the beam of collimated monochromatic light while displacing the substrate in a direction parallel to lines of the mask gratings.

5. The method according to claim 1, wherein:
N=3 or more;
a periodic pattern in the mask contains at least three regions with at least two height steps of 1/N of a Talbot period in a patterned surface of the mask; and
changes of separation for exposing each point of the photosensitive layer in the second and later sub-exposures are obtained by illuminating the at least three regions of linear grating with the beam of collimated monochromatic light while displacing the substrate in a direction parallel to lines of the mask gratings.

6. The method according to claim 1, wherein mi=0 for all sub-exposures following the first sub-exposure.

7. The method according to claim 1, which further comprises repeating the performing and changing steps a plurality of times wherein the separation during the first sub-exposure of each repeat sequence is the same or different to the separation employed during the first sub-exposure of the first sequence.

8. The method according to claim 1, wherein at least one of the sub-exposures is sub-divided into a set of sub-sub-exposures that are performed at a same separation as the respective sub-exposure such that a summation of exposure doses for a set corresponds to that for the respective sub-exposure, and wherein the sub-sub-exposures are temporally interspersed between other sub-exposures or between sub-sub-exposures derived from other sub-exposures.

9. An apparatus for printing a desired one-dimensional or two-dimensional periodic pattern of features into a photosensitive layer, the apparatus comprising:
a mask bearing a periodic mask pattern of features;
a substrate bearing the photosensitive layer;
means for disposing the substrate substantially parallel to and with a separation from said mask;
means for forming a beam of collimated monochromatic light for illuminating said periodic mask pattern of features so that a light-field transmitted by said mask forms Talbot image planes separated by a Talbot distance; and
means for performing N sub-exposures of said mask with the beam and changing a separation between sub-exposures such that a relative separation during an ith sub-exposure with respect to that during a first sub-exposure is given by (mi+ni/N) times the Talbot distance, where values mi is an integer and ni takes each of integer values from 0 to N−1 for different sub-exposures, and exposing the periodic mask pattern of features to a same energy density of illumination for each sub-exposure, wherein a period is selected in relation to a wavelength of illumination so that substantially only a zeroth and first diffraction orders are transmitted by said mask.

10. A method for printing a desired one-dimensional or two-dimensional periodic pattern of features into a photosensitive layer, which method comprises the steps of:
providing a mask bearing a one-dimensional or two-dimensional periodic mask pattern of features;
providing a substrate bearing the photosensitive layer;
disposing the substrate substantially parallel to and with a separation from the mask;
forming a beam of collimated monochromatic light for illuminating the periodic mask pattern of features;
illuminating the periodic mask pattern of features with the beam in a first sub-exposure so as to expose the photosensitive layer to an intensity distribution;
laterally displacing the intensity distribution to expose the photosensitive layer in a second sub-exposure, relative to the first sub-exposure by a distance and in a direction that correspond to those between a feature in the periodic mask pattern of features and a point in the periodic mask pattern of features that is equidistant, in a case of a one-dimensional pattern, between two neighboring mask features or, in the case of a two-dimensional pattern, between at least three neighboring mask features;
illuminating the mask pattern with the beam so that the photosensitive layer is exposed to the intensity distribution in the second sub-exposure; and
selecting a period in relation to a wavelength of illumination so that substantially only a zeroth and first diffraction orders are generated by the mask.

11. The method according to claim 10, which further comprises forming the two-dimensional pattern as a square array and the point in the periodic mask pattern of features is equidistant between four neighboring mask features.

12. The method according to claim 10, which further comprises:
forming the two-dimensional pattern as a hexagonal array and the point in the periodic mask pattern of features is equidistant between three neighboring mask features; and
laterally displacing the intensity distribution to expose the photosensitive layer in a third sub-exposure, relative to the first sub-exposure by a second distance and in a second direction that correspond to those between a second mask feature and a second point in the periodic mask pattern of features that is equidistant between second three neighboring mask features; and
illuminating the periodic mask pattern of features with the beam in a third sub-exposure, wherein the second three neighboring features cannot be transposed to the three neighboring features by a translation operation alone.

13. The method according to claim 10, which further comprises:
forming the two-dimensional pattern as a rectangular array, and the point in the periodic mask pattern of features is equidistant between four neighboring mask features;
laterally displacing the intensity distribution to expose the photosensitive layer in a third sub-exposure, relative to the first exposure by a second distance and in a second direction that correspond to those between a second mask feature and a second point in the periodic mask pattern of features that is equidistant between first two neighboring features;

illuminating the periodic mask pattern of features with the beam in a third sub-exposure;

laterally displacing the intensity distribution to expose the photosensitive layer in a fourth sub-exposure, relative to the first exposure by a third distance and in a third direction that correspond to those between a third mask feature and a third point in the periodic mask pattern of features that is equidistant between second two neighboring features; and illuminating the periodic mask pattern of features with the beam in a fourth sub-exposure, wherein a direction of offset between the first two neighboring features is orthogonal to that between the second two neighboring features.

14. The method according to claim 10, which further comprises producing a displacement of the intensity distribution by a lateral displacement of one of the substrate and the mask.

15. The method according to claim 10, which further comprises producing the lateral displacement of the intensity distribution at the photosensitive layer by a change in angle of the beam illuminating the mask, and the sub-exposures are performed sequentially.

16. The method according to claim 10, wherein the lateral displacement of the intensity distribution at the photosensitive layer is produced by light illuminating the mask at a different angle of incidence to that employed for the first sub-exposure, and the sub-exposures are performed simultaneously.

17. The method according to claim 10, wherein the sub-exposures are performed simultaneously.

18. The method according to claim 10, wherein:

the periodic mask pattern of features is composed of two neighboring regions of linear grating having a same period, lines in one region being laterally shifted by one half of a grating period with respect to lines in the other region; and a lateral displacement of the intensity distribution for exposing each point of the photosensitive layer in the second sub-exposure is obtained by illuminating the two regions of linear grating with the beam of collimated monochromatic light while displacing the substrate in a direction parallel to the lines of the mask gratings.

19. The method according to claim 10, wherein:

the periodic mask pattern of features is composed of a row of four neighboring regions of linear grating having a same period, lines in the second and fourth regions being laterally shifted with respect to lines in the first and third regions by one half of the grating period; and a lateral displacement of the intensity distribution for exposing each point of the photosensitive layer in the second sub-exposure is obtained by illuminating the four regions of linear grating with the beam of collimated monochromatic light while displacing the substrate in a direction parallel to the lines of the mask gratings.

20. An apparatus for printing a desired one-dimensional or two-dimensional periodic pattern of features into a photosensitive layer, the apparatus comprising:

a mask bearing a one-dimensional or two-dimensional periodic mask pattern of features;

a substrate bearing the photosensitive layer;

means for disposing the substrate substantially parallel to and with a separation from the mask;

means for forming a beam of collimated monochromatic light for illuminating said periodic mask pattern of features;

means for performing sub-exposures of the mask using said beam and controlling an energy density delivered in each sub-exposure; and means for laterally displacing the intensity distribution exposing the photosensitive layer between sub-exposures by a distance and in a direction that correspond those between a feature in said periodic mask pattern of features and a point in said periodic mask pattern of features that is equidistant, in a case of a one-dimensional mask pattern, between two neighboring mask features or, in a case of a two-dimensional mask pattern, between at least three neighboring mask features;

wherein a period is selected in relation to a wavelength of illumination so that substantially only a zeroth and first diffraction orders are generated by said mask.

* * * * *